INVENTOR
FRANK W. MILLS
BY Smart & Biggar
ATTORNEYS.

United States Patent Office 3,315,094

Patented Apr. 18, 1967

3,315,094

GATED LIMITER CIRCUIT

Frank Wilton Mills, Lanark County, Ontario, Canada, assignor to Northern Electric Company Limited, Montreal, Quebec, Canada Filed Jan. 13, 1964, Ser. No. 337,312
2 Claims. (Cl. 307—88.5)

This invention relates to an amplitude limiter circuit which provides an output signal of a relatively fixed amplitude whenever the input signal exceeds a predetermined level.

Limiter circuits are known in the art which provide a fixed amplitude output signal of the same fundamental frequency as the input signal. Such circuits are employed in frequency modulated receivers where it is desirable to elimniate amplitude variations of the frequency modulated signals prior to detection. When the level of the F.M. signal, at the input to the receiver is relatively high, the receiver output is quieted due to the presence of this strong F.M. signal. If, however, the signal level is very low or nil, the quieting stops and an undesirable random noise can be heard at the receiver output. To eliminate this random noise, a squelch circuit is employed which automatically quiets the receiver by reducing its gain or by open circuiting the signal path whenever the F.M. signal level is below a predetermined value. The magnitude of the F.M. signal at which this occurs is known as the threshold level.

The present invention incorporates both an amplitude limiter and a squelch circuit in a single gated limiter circuit which utilizes relatively few components and yet achieves the high sensitivity desired to produce the abrupt transition from one state where the input signal is below the threshold level and no output signal is produced, and the other state where the input signal is above the threshold level and a relatively constant amplitude output signal is produced. Thus, at the output of the gated limiter circuit there is either an amplitude limited signal or no signal at all.

The present invention comprises a transistor amplifier having both an emitter and a collector load circuit. The emitter load circuit includes a D.C. isolated varistor in shunt with a degenerate feedback resistor, while the collector load circuit includes a means for producing a D.C. control voltage which is proportional to the signal voltage level appearing across this load. The signal voltage appearing across the varistor is coupled to the output of the gated limiter circuit through a gate circuit which is controlled by the D.C. control voltage. Thus, when the amplitude of the input signal is below the threshold level, insufficient D.C. control voltage is produced in the collector load circuit to unblock the gate which results in no output signal. However, when the input signal level is above the threshold level, the gate circuit is unbocked and the signal voltage across the varistor is coupled to the output. The outpupt signal voltage is limited in amplitude by the non-linear characteristics of the varistor.

A preferred embodiment of the invention will now be described with reference to the accompanying drawings in which.

Figure 1:
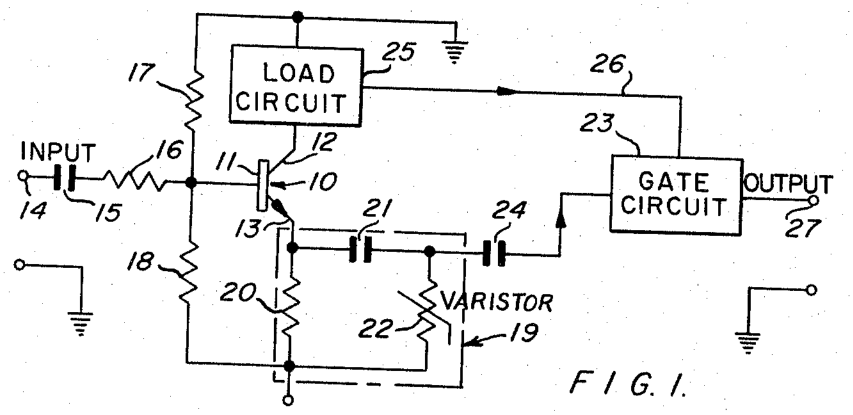
FIGURE 1 is a partial block schematic diagram of a gated limiter circuit.

Referring now to FIGURE 1 of the drawings, the gated limiter circuit comprises a type NPN transistor 10 having a base 11, a collector 12 and an emitter 13. The base 11 is connected to one of the input terminals 14 through a D.C. coupling capacitor 15 and an input impedance padding resistor 16. The operating bias for the transistor 10 is established by a divider network comprising resistors 17 and 18 which is connected between a negative source of operating potential and ground; the junction of the two resistors 17 and 18 is connected to the base 11.

An emitter load circuit 19 comprises a degenerate feedback resistor 20 which is connected between the emitter and the negative source of potential, and a series connected D.C. blocking capacitor 21 and a varistor 22 which are connected in shunt with the resistor 20. The varistor 22 in the present embodiment comprises two diodes connected in shunt in reverse polarity; however, other forms of varistors may be used. The junction of the capacitor 21 and the varistor 22 is connected to the signal input of a gate circuit 23 through a further D.C. coupling capacitor 24.

A collector load circuit 25 having a D.C. rectifier is connected between the collector 12 and ground. A D.C. control lead 26 is connected from the output of the rectifier in the load circuit 25 to the control input of the gate circuit 23. The signal output from the gate circuit 23 is connected to an output terminal 27.

An input signal, connected between the input terminal 14 and ground, is coupled to the base 11 of the transistor 10 through the coupling capacitor 15 and the impedance padding resistor 16. The function of the resistor 16 is to decrease input impedance variations due to changes in the base impedance with various operating conditions of the transistor 10 as will be described hereinafter. The values of the resistors 17 and 18 are chosen so that the transistor 10 will operate as a Class A amplifier. The dynamic impedance of the emitter load circuit 19 is dependent upon the instantaneous value of the signal voltage appearing across it due to the varying impedance of the varistor 22 which is effectively in shunt with the resistor 20. Thus, when the input signal voltage level is relatively low, the impedance of the varistor remains relatively high throughout the entire cycle of the input signal. Consequently, the resistor 20 is effectively unbypassed and therefore acts not only as a current limiting resistor but also as a degenerate feedback resistor. Due to this heavy feedback the signal voltage level appearing across the resistor 20 will be approximately the same as the input signal voltage level applied to the base 11. The voltage gain across the collector load circuit 25 will therefore be relatively small.

If the amplitude of the input signal at terminal 14 is now increased, the impedance of the varistor 22 will be substantially decreased over a portion of each operating cycle. Due to this lower dynamic impedance of the conducting varistor 22, the feedback resistor 20 is effectively bypassed over a portion of each cycle and hence the voltage gain across the load circuit 25 is substantially increased. This results in a sharp increase in the D.C. control voltage which is applied to the gate circuit 23 by means of the control lead 26. This in turn unblocks the gate circuit 23 and thereby couples the signal voltage appearing across the varistor 22 to the output terminal 27 through the gate circuit 23 and the coupling capacitor 24. Thus, the gate circuit 23 is unblocked just as limiting of the signal voltage commences across the emitter load circuit 19.

A further increase in the input signal level will cause a further decrease in the dynamic impedance of the varistor 22 which results in a relatively constant output signal voltage level due to attenuation. The input signal voltage level, at which the gate circuit 23 is unblocked, is known as the threshold level of the circuit.

Figure 2:
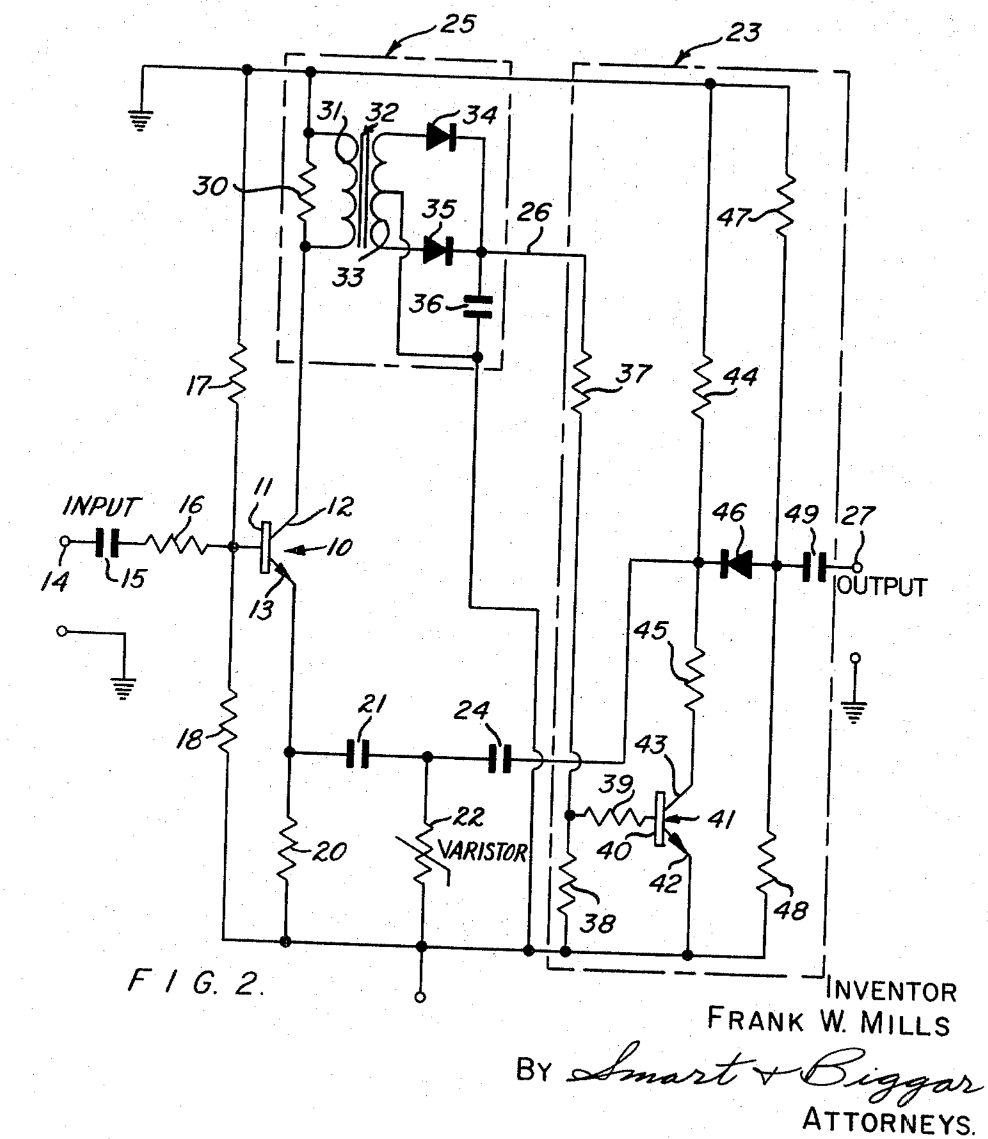
FIGURE 2 is a schematic circuit diagram of the gated limiter circuit illustrated in FIGURE 1.

In FIGURE 2 of the drawings, the collector load circuit 25 and the gate circuit 23 are illustrated in schematic form while all the other components are as shown in FIGURE 1.

Referring now to FIGURE 2 of the drawings, the collector load circuit 25 comprises a resistor 30 connected between the collector 12 and ground. A primary winding 31 of a transformer 32 is connected in shunt with the resistor 30. The transformer 32 has a center-tapped secondary winding 33 which in conjunction with two diodes 34 and 35 form a conventional full-wave rectifier. The center-tap of the winding 33 is returned to the negative source of potential. A filter capacitor 36 is connected between the junction of the two diodes 34 and 35 and the negative source of potential. The junction of the two diodes 34 and 35 is also connected to one end of the control lead 26.

The gate circuit 23 comprises serially connected resistors 37 and 38 which are connected in shunt with the filter capacitor 36. The junction of the two resistors 37 and 38 is connected through a current limiting resistor 39 to the base 40 of a type NPN transistor 41. The emitter 42 of the transistor 41 is connected to the negative source of potential while the collector 43 of the transistor 41 is connected through serially connected resistors 44 and 45 to ground. The junction of the two resistors 44 and 45 is connected to one end of the coupling capacitor 24 and also to the cathode of a diode 46. The anode of the diode 46 is connected to the junction of two serially connected resistors 47 and 48 which in turn are connected from ground to the negative source of potential respectively. The junction of the two resistors 47 and 48 is also connected to one end of a coupling capacitor 49. The other end of the capacitor 49 is connected to the output terminal 27. The values of the resistors 44, 45, 47 and 48 are so chosen that when the transistor 41 is cut-off, the diode 46 is back biased and when the transistor 41 is conducting the diode 46 is forward biased.

With only a small input signal (below the threshold level) insufficient voltage is induced in the secondary winding 33 to cause any appreciable conduction of the diodes 34 and 35. When the diodes 34 and 35 are substantially non-conducting, the base 40 of the transistor 41 is at approximately the same potential as the emitter 42 and consequently the transistor 41 is cut-off. As stated above, when the transistor 41 is cut-off, the diode 46 is back-biased and consequently the gate circuit 23 is blocked. This results in no signal voltage appearing at the output terminal 27 relative to ground.

If the input voltage level is above the threshold point, sufficient voltage is induced in the transformer secondary to cause forward conduction, of the two diodes 34 and 35 on alternate half cycles of the signal voltage. This results in a current flow through the resistor divider network comprising resistors 37 and 38. The current flow through the divider network produces a voltage drop across resistor 38 which renders the transistor 41 conducting. This in turn increases negatively the voltage at the cathode of the diode 46 and thereby renders it conducting. The impedance of the diode 46 is therefore sharply reduced and the signal voltage appearing across the varistor 22 is coupled with negligible attenuation through the capacitors 24 and 49 and the diode 46 to the output terminal 27.

What I claim as my invention is:

1. A gated limiter circuit comprising a pair of input terminals for connecting an input signal thereto, a pair of output terminals for connecting an output signal therefrom, a transistor having base, collector and emitter electrodes, a source of operating potential for said transistor, means for coupling the input signal from said input terminals to the base electrode, a degenerative feedback resistor connected between said emitter electrode and one terminal of said source, a direct current isolated varistor connected in shunt with said resistor, a load circuit connected between said collector electrode and the other terminal of said source, said load circuit including rectifier means for producing a direct current control voltage which is proportional to the amplitude of the input signal coupled from said transistor to said load circuit, and a gate circuit responsive to the direct current control voltage for coupling the output signal which appears across said varistor to said output terminals when said control voltage is greater than a predetermined level.

2. A gated limiter circuit as defined in claim 1, in which the gate circuit comprises: a diode connected between said varistor and said output terminals; and bias means, including a second transistor, for retaining said diode reverse biased when said control voltage is less than said predetermined level and for retaining said diode forward biased when said control voltage is greater than said predetermined level.

No references cited.

ARTHUR GAUSS, *Primary Examiner.*

J. ZAZWORSKY, *Assistant Examiner.*